United States Patent
Wang et al.

(10) Patent No.: US 10,638,075 B1
(45) Date of Patent: Apr. 28, 2020

(54) COUNTER DESIGN WITH VARIOUS WIDTHS FOR IMAGE SENSOR

(71) Applicant: OmniVision Technologies, Inc., Santa Clara, CA (US)

(72) Inventors: Zejian Wang, San Jose, CA (US); Chun-Hsiang Chang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/416,024

(22) Filed: May 17, 2019

(51) Int. Cl.
*H04N 5/3745* (2011.01)
*H04N 5/369* (2011.01)
*G11C 11/41* (2006.01)

(52) U.S. Cl.
CPC ....... *H04N 5/37452* (2013.01); *H04N 5/3698* (2013.01); *G11C 11/41* (2013.01)

(58) Field of Classification Search
CPC . H04N 5/37452; H04N 5/3698; H04N 5/3745
See application file for complete search history.

(56) References Cited

U.S. PATENT DOCUMENTS

2017/0257578 A1* 9/2017 Velichko ........... H01L 27/14629
2019/0014281 A1* 1/2019 Kobayashi ........... H04N 5/3745
2019/0342513 A1* 11/2019 Doege ................. H04N 5/3456

* cited by examiner

Primary Examiner — Nicholas G Giles
(74) Attorney, Agent, or Firm — Christensen O'Connor Johnson Kindness PLLC

(57) ABSTRACT

Counters with various widths for an image sensor. An image sensor includes a plurality of image pixels arranged in rows and columns of a pixel array. A plurality of memory cells are individually coupled to corresponding columns of the pixel array. The memory cells are arranged in a memory bank. The memory bank includes a first memory cell coupled to a first column of the pixel array. The first memory cell includes a first counter having a first width. A second memory cell is coupled to a second column of the pixel array. The second memory cell comprises a second counter having a second width. The first width and the second width are different.

18 Claims, 6 Drawing Sheets

COUNTER DESIGN WITH VARIOUS WIDTHS FOR IMAGE SENSOR

BACKGROUND INFORMATION

Field of the Disclosure

This disclosure relates generally to the design of counters of image sensors, and in particular, relates to the counters having non-uniform dimensions.

Background

Image sensors have become ubiquitous. They are widely used in digital still cameras, cellular phones, security cameras, as well as medical, automobile, and other applications. The technology for manufacturing image sensors continues to advance at a great pace. For example, the demands for higher image sensor resolution and lower power consumption motivate further miniaturization and integration of image sensors into digital devices.

Increased image resolution and frame rates necessitate higher data transfer rates to store the pixel values of the imaging sensors to a memory. Typically, the memory that stores these pixel values is arranged as a row of memory cells of a memory bank. Within the memory bank, each memory cell is operationally coupled to a column of pixels of the imaging sensor to receive and store data from the pixels in this column of pixels.

As the frame rates and image resolution increase, data transfer rates from the image sensor to the memory bank also increases. In practice, data transfer rates are increased by increasing the operating frequency of the memory cells, which, in turn, increases power dissipation of the individual memory cells of the memory bank. Therefore, when a fixed supply voltage $V_{DD}$ is provided to a row of memory cells of the memory bank, each memory cell sinks some electrical current in operation, and the supply voltage drops for the subsequent memory cells in the row. As a result, some memory cells may not have sufficient voltage to operate properly, especially at higher frequencies and/or when being more distant from the source of $V_{DD}$. Therefore, systems and methods are needed for improved voltage delivery to the memory cells of the memory bank.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
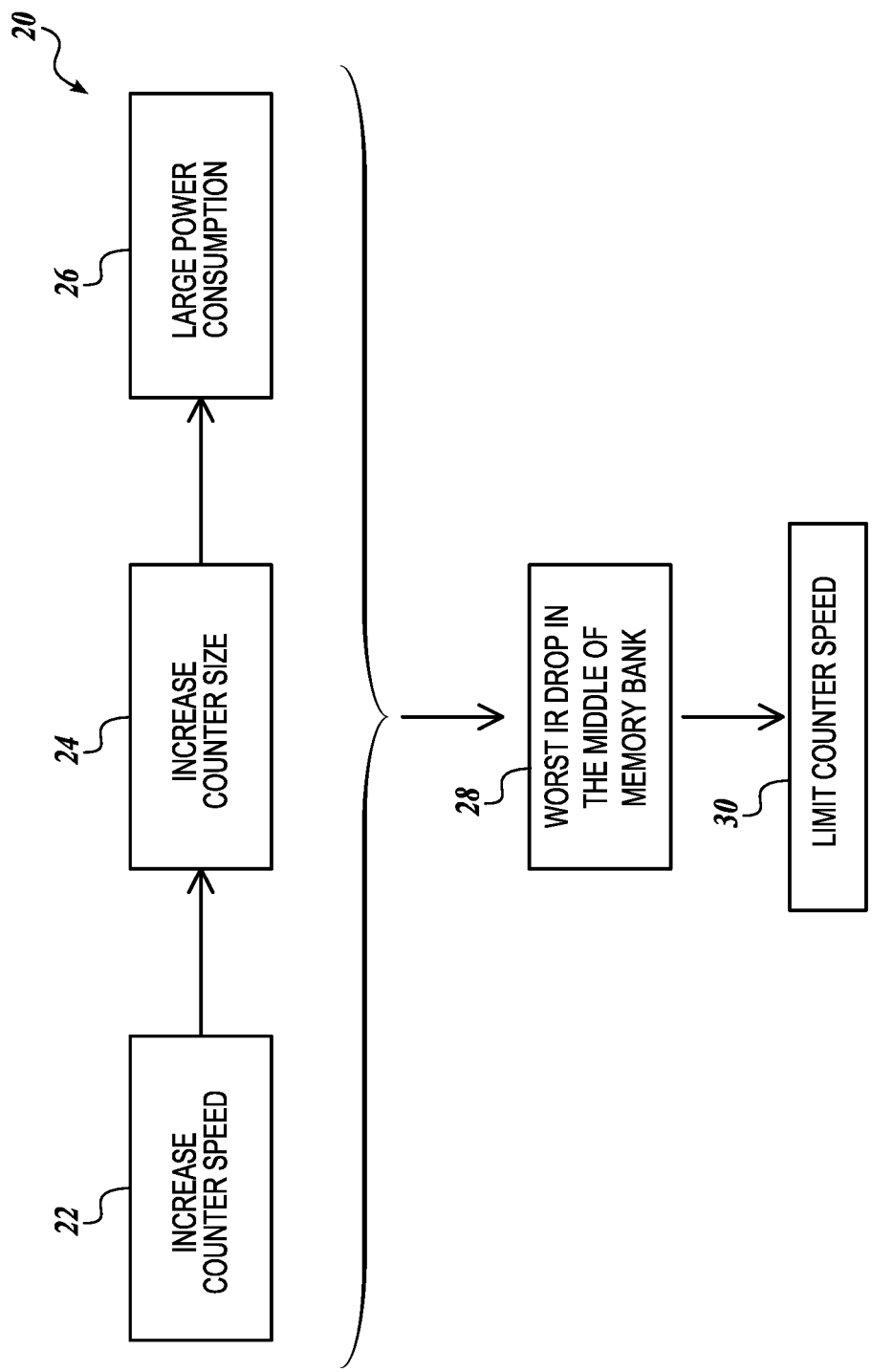
FIG. 1 is a flow diagram of a design process of a memory bank in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Counters for image sensors, and in particular, the counters having non-uniform dimensions are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Examples in accordance with the teachings of the present technology are directed to counters having variable dimensions. Generally, memory cells that receive data from a pixel array are arranged in a memory bank. In some embodiments, each memory cell receives data from a corresponding column of pixels. A memory cell may be coupled to a comparator that connects the memory cell with a given pixel of the pixel column for a duration of time. Within a given memory cell, dedicated counters capture digital values corresponding to a charge of the pixel (also referred to as a pixel value or a value of the pixel). These digital values (e.g., counter $1^{st}$ bit, counter $2^{nd}$ bit, etc., of the pixel (i,j)) are stored on the associated data storage cell (e.g., a latch or a data latch). After the value of the pixel (i,j) is captured, the comparator connects the memory cell with the next pixel (i+1,j), and the process repeats until the values of all pixels of the image sensor are captured and stored.

FIG. 1 is a flow diagram of a design process 20 of a memory bank in accordance with an embodiment of the present technology. In particular, the design process illustrated in FIG. 1 is relevant to designing the counters of the memory cells. As the bandwidth and resolution of the image sensors increase, the speed at which the counters of the memory cell operate should also correspondingly increase (block 22). Generally, the counters operate faster when size of the transistors that form the counter is increased, resulting in the increased size of the counter itself (block 24). However, the larger counters generally also consume more power (block 26), because their larger transistors tend to sink more current. Some ramifications of a sequence of design steps shown in blocks 22-24 are discussed below in relation to blocks 28 and 30.

In some embodiments, the memory cells of the entire memory bank are connected to a common supply voltage ($V_{DD}$) and a common ground voltage ($V_{GND}$). The conductive traces that supply $V_{DD}$ and $V_{GND}$ may be attached to, for example, the periphery of the memory bank. The individual memory cells in the memory bank may be viewed as the resistors that operate in series, as explained in more detail with respect to FIG. 2 below. As a result of this serial arrangement of the memory cells, a voltage differential $V_{DD}$ -$V_{GND}$ generally varies along the row of memory cells. For instance, peripherally located memory cells that are closer to the sources of $V_{DD}$ and $V_{GND}$ have higher voltage differential $V_{DD}$ -$V_{GND}$ available for their operation. Conversely, those memory cells that are more centrally located within the memory bank have smaller voltage differential $V_{DD}$ -$V_{GND}$ (also referred to as "IR drop"). Under some scenarios, for example, as the power dissipation of the individual memory cells is increased with increased frequency of operation, the voltage differential $V_{DD}$ -$V_{GND}$ that is available to the centrally located memory cells may be insufficient for proper functioning of these memory cells (block 28). In the context of the overall design process, the above-described problem of insufficient voltage differential available to the centrally located memory cells limits the frequency of the counter (block 30). However, such design limitation goes counter to the requirements for increased frequency (speed), as explained with respect to the block 22 above. Therefore, a designer of the memory banks is faced with a difficult task of optimizing power delivery to memory cells of the memory bank. Some embodiments of the inventive technology that improve power delivery for the memory cells of the memory bank are described with respect to FIG. 2 below.

Figure 2:
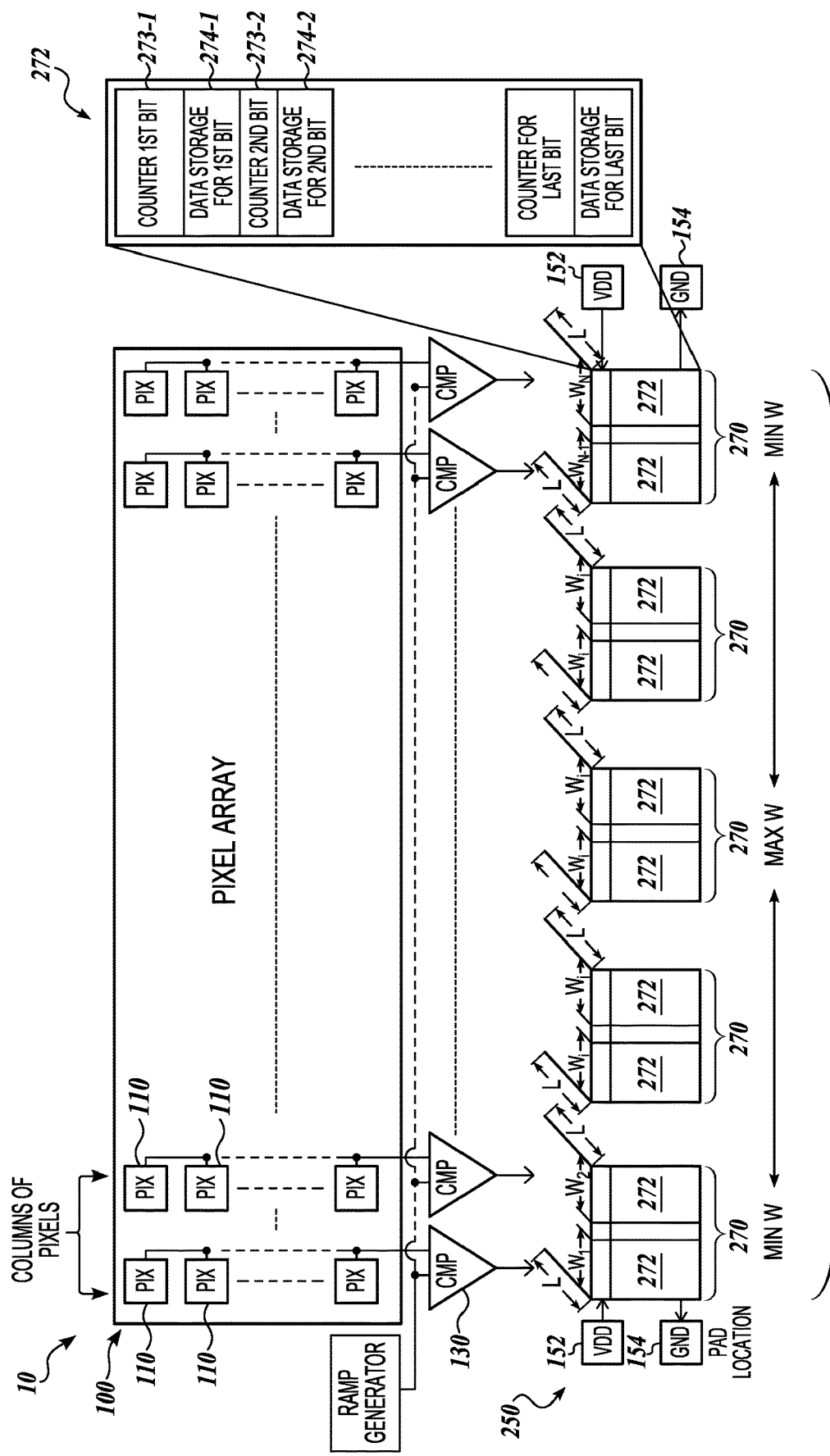
FIG. 2 is a schematic diagram of an image sensor in accordance with an embodiment of the present technology.

FIG. 2 is a schematic diagram of an image sensor 10 in accordance with an embodiment of the present technology. The image sensor 10 includes pixels 110 that are arranged in rows and columns of a pixel array 100. When the image sensor 10 is exposed to light, the individual pixels 110 acquire certain voltage values. These voltage values of the individual pixels can be saved in memory cells 272 that are connected to the pixel columns of the image sensor 10.

In some embodiments, a comparator 130 transfers the values of individual pixels 110 to a memory cell 272 that is connected to a column of the pixel 110. After the value of that pixel is captured, the comparator 130 connects the memory cell to the next pixel in the column, and the process repeats until voltage values of all the pixels of in the column are captured. Other comparators 130 execute the same process on their respective columns of pixels 110. In some embodiments, individual memory cells 272 may be combined into the pairs of memory cells 270. Collectively, the memory cells 272 may be arranged into a memory bank 280.

In some embodiments, each memory cell 272 includes counters 273 and memory 274, where each bit of the pixel value is interpreted by one of the counters 273 and saved in memory 274. For example, the first bit of the pixel value may be interpreted by the counter 273-1 and saved in the memory 274-1, the second bit may be interpreted by the counter 273-2 and saved in the memory 274-2, and so on till the voltage value of the pixel is captured and saved at a prescribed bit resolution. In some embodiments, the memory 274 may be a latch that stores the data (e.g., a data latch or D latch, or other latch for storing data). In other embodiments, the memory 274 may be a static random access memory (SRAM) or an asynchronous static random access memory (ASRAM).

In some embodiments, the memory bank 280 is connected to the supply voltage $V_{DD}$ and common ground voltage $V_{GND}$ at the peripheral memory cells 272. As a result, the more centrally located memory cells 272 sense $V_{DD}$ and $V_{GND}$ after some power was dissipated by the peripheral memory cells. For those centrally located memory cells 272, the supply voltage is $V_{DD}$ -$\Delta V_{DD}$, the ground voltage is $V_{GND}$ +$\Delta V_{GND}$, therefore decreasing their available voltage difference. To properly operate, the memory cells 272 should be supplied with at least a design minimum of the voltage difference.

In some embodiments, the dimensions of the memory cells 272 may be selected such that a magnitude of the voltage difference $V_{DD}$ -$V_{GND}$ is optimized for the centrally located memory cells. In one embodiment, the peripherally located memory cells 272 may have smaller dimensions (e.g., width $W_1$ and/or length $L_1$; width $W_N$ and/or length $L_N$; width $W_{N-1}$ and/or length $L_{N-1}$; etc.) while the centrally located memory cells 272 have larger dimensions (e.g., width W and/or length $L_i$, etc.). In other embodiments, only the width $W_i$ varies, while the length L remains fixed from one memory cell 272 to another. Because the voltage drop across a given memory cell 272 increases with the increased dimensions of the memory cell, the voltage drop of the memory cells having smaller dimensions is smaller, and vice versa (all other design parameters being equal). As a result, the voltage drop at the peripherally located memory cells 272 is reduced, leaving a larger voltage budget for the more centrally located memory cells 272. In many embodiments, such allocation of an overall voltage budget increases the availability of $V_{DD}$ -$V_{GND}$ at the centrally located memory cells 272, therefore improving their performance.

Figure 3:
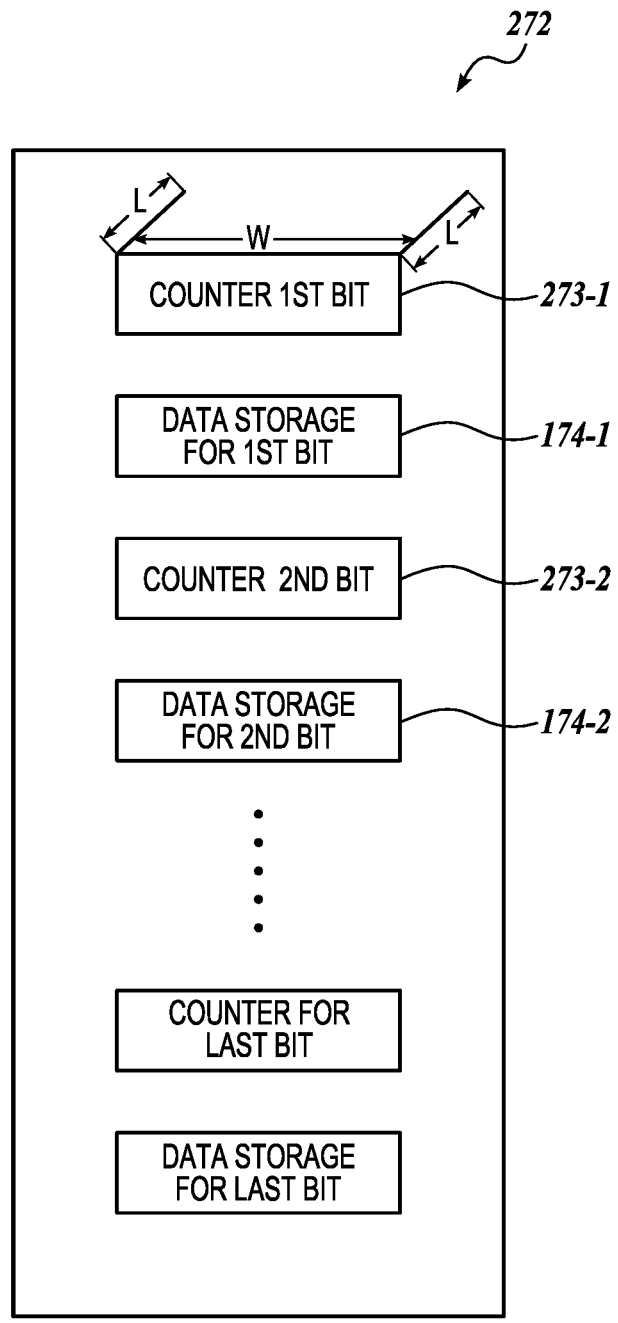
FIG. 3 is a schematic diagram of a memory cell in accordance with an embodiment of the present technology.

FIG. 3 is a schematic diagram of a memory cell 272 in accordance with an embodiment of the present technology. The illustrated memory cell includes counters for the first, second, etc., bits of the value assignable to a particular pixel. These bits are assigned to their respective memories, for example, data latch. The dimensions of the counters are referred to as L (length) and W (width). However, it is to be understood that the designations L and W stand for a more general representation of a transistor size. For example, an individual counter may include multiple transistors and/or other semiconductor elements. The designations L and W generally refer to the size of these elements, which collectively determine the size of the counter itself. As explained above, as the size of the counter, that is, the W, is larger, the internal electrical resistance of the counter is smaller, and the counter dissipates more power, therefore consuming a larger portion of the overall $V_{DD}$ -$V_{GND}$ budget.

Figure 4:
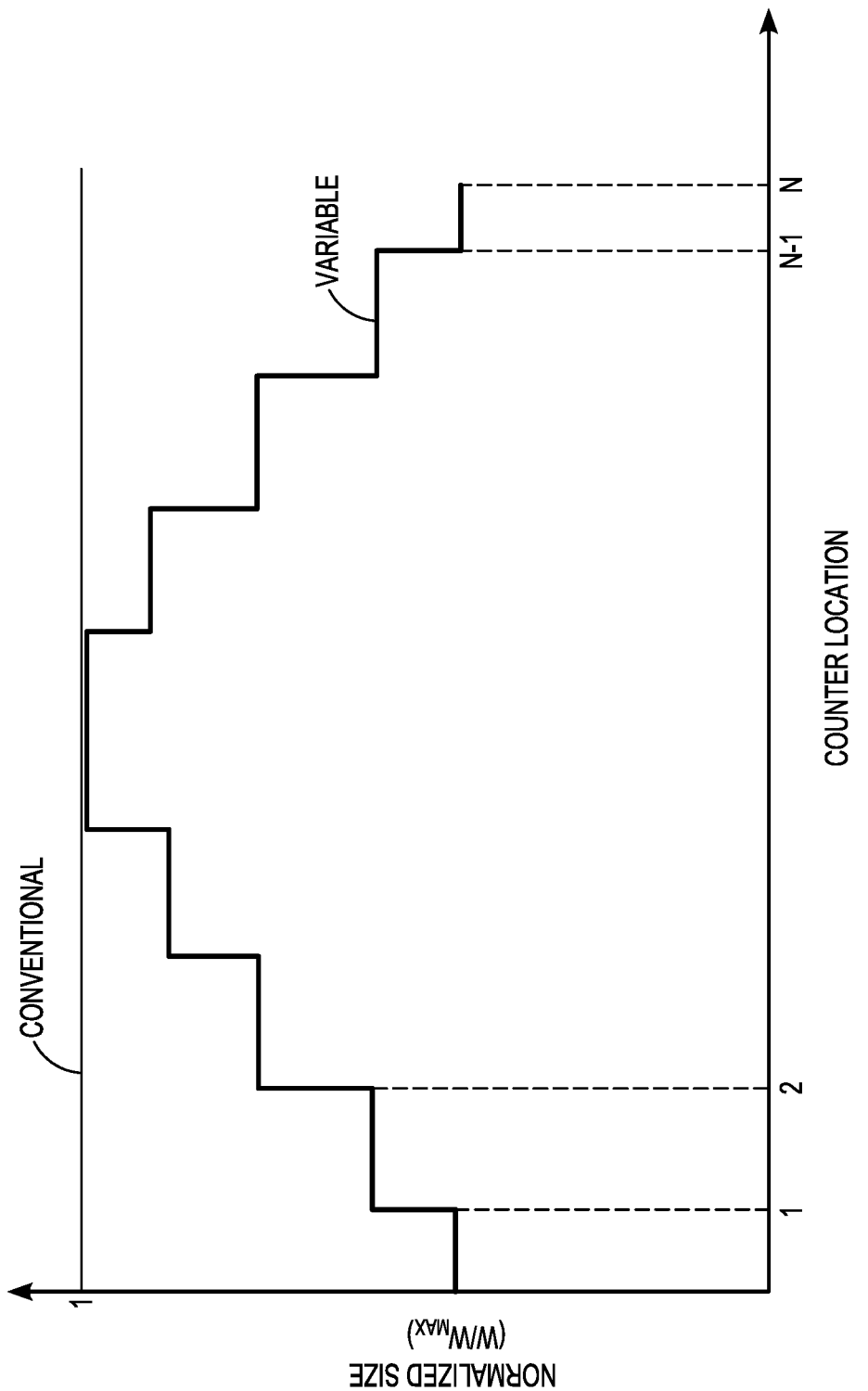
FIG. 4 is a graph of a distribution of dimensions of the counter in accordance with an embodiment of the present technology.

FIG. 4 is a graph of a distribution of the counter dimensions in accordance with an embodiment of the present technology. The horizontal axis shows location of the counters along the memory bank. The vertical axis shows a normalized size ($W/W_{MAX}$) of the counters. In the conventional designs, all the counters have the same size, therefore the graph of their normalized size is a constant value. In the illustrated embodiment of the inventive design, the peripherally located counters are smaller than the centrally located counters.

In the sample graph of FIG. 4, the counters have several different sizes. However, in some embodiments, the counters may be designed to have a relatively small number of sizes, for example, just two or three sizes. In other embodiments, the number of different sizes of the counters may, for example, approach one half of the total number of counters. Other distributions of the size of counters are available in different embodiments. For example, in some embodiments, the memory cells at one side of the memory bank may be smaller than the memory cells at the other side of the memory bank, while counters of the centrally located memory cells have a size that is between the two peripheral sizes. In other embodiments, power to the memory bank may be supplied at its peripheral ends as well as in the middle of the memory bank. With these embodiments, the largest memory cells are placed in between the middle and the left peripheral end, and between the middle and the right peripheral end of the memory bank.

Figure 5:
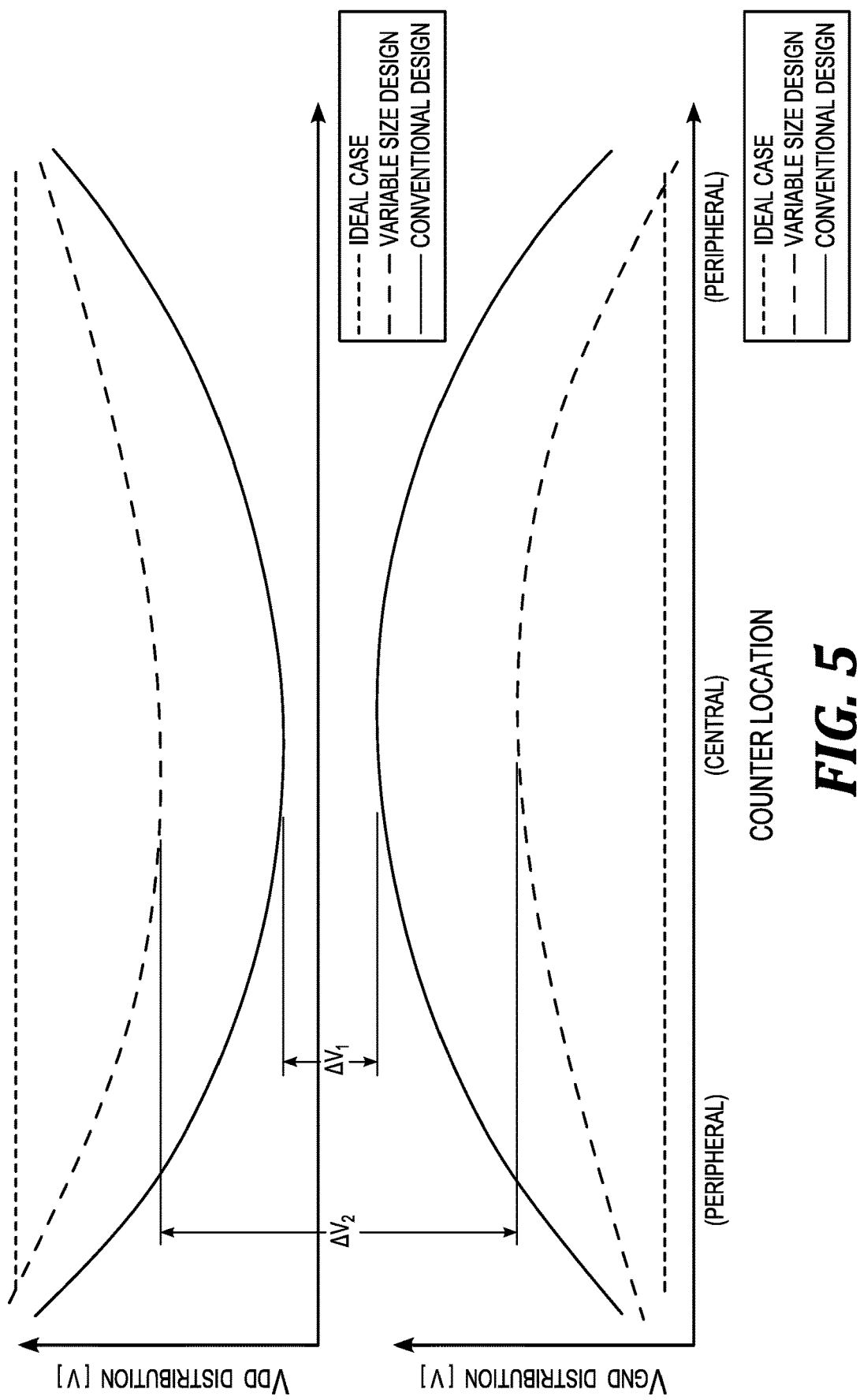
FIG. 5 shows graphs of voltage distribution in a memory bank in accordance with an embodiment of the present technology.

FIG. 5 shows graphs of voltage distribution in a memory bank in accordance with an embodiment of the present technology. The upper graph shows a distribution of $V_{DD}$ along the memory bank 280. The lower graph shows a distribution of $V_{GND}$ along the memory bank. The horizontal axes in the graphs show location of the memory cells 272 within the memory bank 280 (e.g., peripheral, central). The vertical axes in the graphs show the voltages ($V_{DD}$ and $V_{GND}$). The three cases shown in the graphs correspond to a conventional design, a variable size design and an ideal case design. These three cases correspond to the results for a relatively large number of counters having different sizes. Under these assumptions, the distributions of $V_{DD}$ and $V_{GND}$ over the memory bank approximate smooth functions.

With the conventional design (solid line), the $V_{DD}$ -$V_{GND}$ relatively quickly drops for the centrally located memory cells 272, because of the relatively large power dissipation of the peripherally located memory cells 272. The minimum of the $V_{DD}$ -$V_{GND}$ is labeled as $\Delta V_1$. As explained above, in some instances this $\Delta V_1$ may be insufficient for the proper functioning of the counters that are close to the middle of the memory bank.

With the embodiments of the inventive technology (long dash line), the reduction in $V_{DD}$ -$V_{GND}$ available to the centrally located memory cells 272 is less pronounced, owing to a smaller power dissipation of the peripherally located memory cells 272. As a result, the available $V_{DD}$ -$V_{GND}$ budget becomes larger, and, if properly designed, this voltage budget is sufficient for the operation of all the memory cells, including the centrally located ones. The minimum of the $V_{DD}$ -$V_{GND}$ for this case is labeled as $\Delta V_2$.

The short dash line represents an idealized case where $V_{DD}$ -$V_{GND}$ remains constant. Such distribution of $V_{DD}$ -$V_{GND}$ is generally not achievable in practical situations. The ideal distribution may approximate, for example, very small peripherally located memory cells coupled with very large centrally located memory cells.

Figure 6:
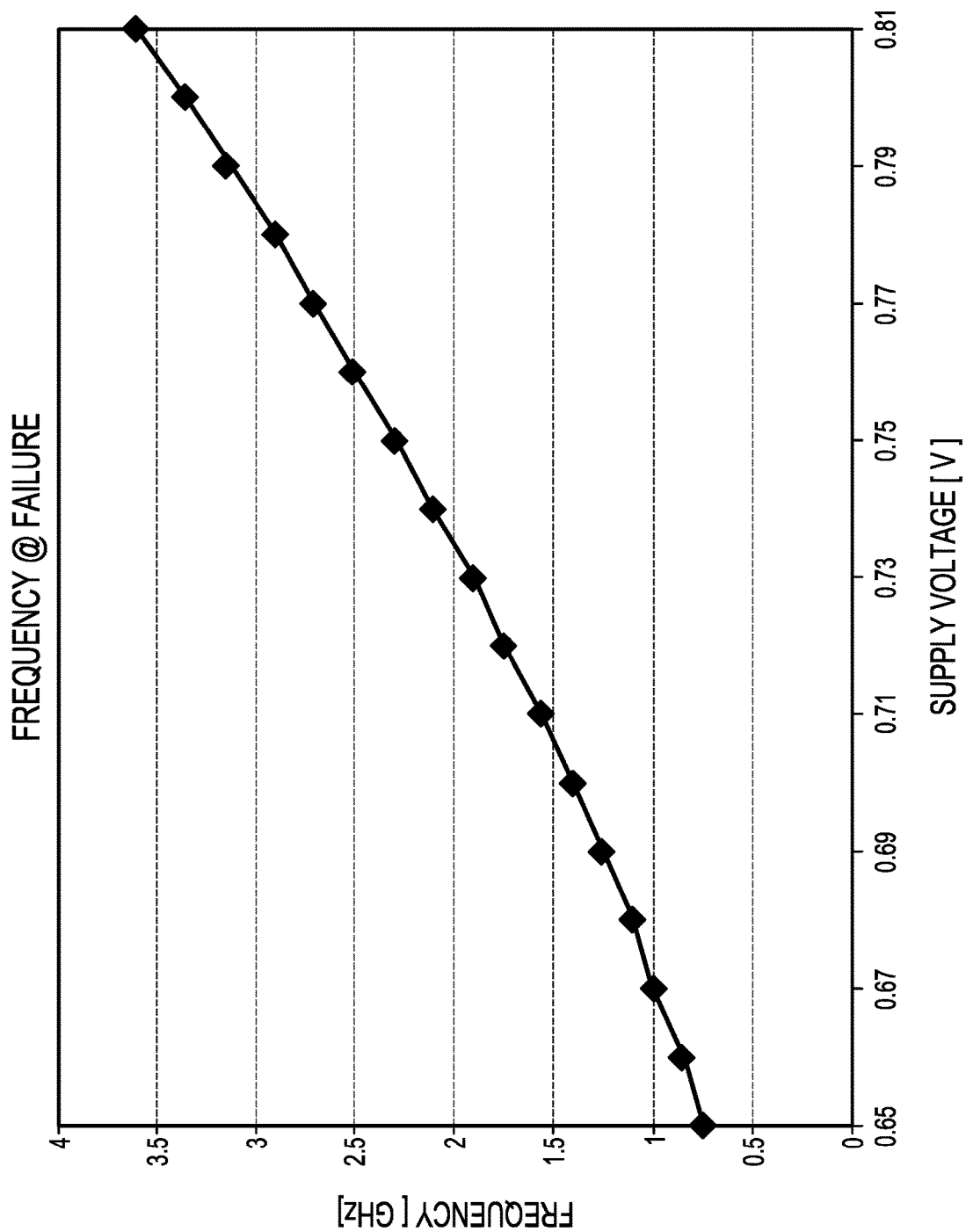
FIG. 6 is a graph of counter frequencies in accordance with an embodiment of the present technology.

FIG. 6 is a graph of counter frequencies in accordance with an embodiment of the present technology. The horizontal axis corresponds to a supply voltage for a given memory cell, i.e., for a given counter. The vertical axis corresponds to a maximum allowable operating frequency at which the counter still operates properly (e.g., without failures or with an acceptable level of failures). Stated differently, the graph shows a required voltage level at which the counter can reliably operate at a given frequency. For example, when the voltage level available to a given counter is about 0.67 V, the counter can reliably operate up to about 1 GHz frequency. When the voltage level available to this counter is about 0.79 V, the same counter can reliably operate up to about 3 GHz frequency. Therefore, in this particular example, even relatively small differences in the supply voltage may significantly affect the maximum operating frequency of the counter. As a result, even relatively small improvements in availability of the $V_{DD}$ -$V_{GND}$ voltage budget may significantly improve the maximum operating frequency of the counters, and, by extension, the maximum operating frequency of the memory bank.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of image pixels arranged in rows and columns of a pixel array; and
   a plurality of memory cells individually coupled to corresponding columns of the pixel array, wherein the plurality of memory cells are arranged in a memory bank, and wherein the memory bank comprises:
   a first memory cell coupled to a first column of the pixel array, wherein the first memory cell comprises a first counter having a first width (W), and
   a second memory cell coupled to a second column of the pixel array, wherein the second memory cell comprises a second counter having a second width,
   wherein the first width and the second width are different.

2. The image sensor of claim 1, wherein the first memory cell is peripherally located with respect to the memory bank, wherein the second memory cell is centrally located with respect to the memory bank, and wherein the second width is greater than the first width.

3. The image sensor of claim 2, wherein the memory bank further comprises a third memory cell coupled to a third column of the pixel array, wherein the third memory cell comprises a third counter coupled to a third column of the pixel array, wherein the third counter has a third width, and wherein the third width is different from the first width and the second width.

4. The image sensor of claim 3, wherein the third memory cell of the memory bank is between the first memory cell and the second memory cell, wherein the third width is greater than the first width, and wherein the third width is less than the second width.

5. The image sensor of claim 2, wherein the first memory cell comprises a first plurality of counters including the first counter, wherein the second memory cell comprises a second plurality of counters including the second counter, wherein the first plurality of counters have the first width, and wherein the second plurality of counters have the second width.

6. The image sensor of claim 2, wherein the first memory cell and the second memory cell comprise data latches.

7. The image sensor of claim 6, wherein the first memory cell comprises a plurality of data latches, and wherein an individual data latch of the plurality of data latches is configured to capture a given bit of the first counter.

8. The image sensor of claim 2, wherein individual memory cells are coupled to the columns of the pixel array, wherein the memory bank is powered by a supply voltage ($V_{DD}$) supplied to the peripherally located memory cells of the memory bank, and wherein a voltage drop between the $V_{DD}$ and a ground voltage ($V_{GND}$) for the peripherally located memory cells is greater than a voltage drop between the $V_{DD}$ and the $V_{GND}$ for the centrally located memory cells.

9. An image sensor, comprising:
a plurality of image pixels arranged in rows and columns of a pixel array; and
a plurality of memory cells individually coupled to corresponding columns of the pixel array, wherein the plurality of memory cells are arranged in a memory bank, and wherein the memory bank comprises:
a first memory cell coupled to a first column of the pixel array, wherein the first memory cell comprises a first counter having a first dimension, and
a second memory cell coupled to a second column of the pixel array, wherein the second memory cell comprises a second counter having a second dimension,
wherein the first dimension and the second dimension are different.

10. The image sensor of claim 9, wherein the first dimension is a first width of the first counter, and wherein the second dimension is a second width of the second counter.

11. The image sensor of claim 10, wherein the first column is peripherally located with respect to the memory bank, wherein the second column is centrally located with respect to the memory bank, and wherein the second width is greater than the first width.

12. The image sensor of claim 9, wherein the first memory cell and the second memory cell comprise data latches.

13. The image sensor of claim 12, wherein the first memory cell comprises a plurality of data latches, and wherein an individual data latch of the plurality of data latches is configured to capture a given bit of the first counter.

14. A method of operating an image sensor, comprising:
acquiring an image by image pixels of the image sensor, wherein the image pixels are arranged in rows and columns of a pixel array;
comparing pixel values by a plurality of comparators, wherein each comparator is operationally coupled to a column of pixels;
receiving outputs of the comparators by a memory bank comprising a plurality of memory cells, wherein individual memory cells receive inputs from their corresponding comparators; and
energizing the memory bank by a supply voltage ($V_{DD}$) provided to peripherally located memory cells of the memory bank,
wherein the plurality of memory cells comprises:
a first memory cell coupled to a first column of the pixel array through its corresponding comparator, wherein the first memory cell comprises a first counter having a first width, and
a second memory cell coupled to a second column of the pixel array through its corresponding comparator, wherein the second memory cell comprises a second counter having a second width,
wherein the first width and the second width are different.

15. The method of claim 14, wherein the first column of the pixel array is peripherally located with respect to the pixel array, wherein the second column of the pixel array is centrally located with respect to the pixel array, and wherein the second width is greater than the first width.

16. The method of claim 15, wherein a voltage drop between the $V_{DD}$ and a ground voltage ($V_{GND}$) for the peripherally located memory cells is greater than a voltage drop between the $V_{DD}$ and the $V_{GND}$ for the centrally located memory cells.

17. The method of claim 15, further comprising a third memory cell coupled to a third column of the pixel array, wherein the third memory cell comprises a third counter coupled to a third column of the pixel array, wherein the third counter has a third width, and wherein the third width is different from the first width and the second width.

18. The method of claim 17, wherein the third memory cell of the memory bank is between the first memory cell and the second memory cell, wherein the third width is greater than the first width, and wherein the third width is less than the second width.

* * * * *